United States Patent
Park

(10) Patent No.: US 8,378,409 B2
(45) Date of Patent: Feb. 19, 2013

(54) NON-VOLATILE MEMORY DEVICE AND METHOD FOR FABRICATING THE SAME

(75) Inventor: Byung-Soo Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/233,182

(22) Filed: Sep. 15, 2011

(65) Prior Publication Data

US 2012/0299082 A1    Nov. 29, 2012

(30) Foreign Application Priority Data

May 26, 2011    (KR) .................. 10-2011-0050032

(51) Int. Cl.
*H01L 29/788* (2006.01)

(52) U.S. Cl. ........ 257/316; 257/211; 257/288; 257/296; 257/314; 257/324; 438/238; 438/253; 438/257; 438/268

(58) Field of Classification Search ............... None
See application file for complete search history.

(56) References Cited

U.S. PATENT DOCUMENTS

2007/0047371 A1*   3/2007   Park et al. ............ 365/230.06

FOREIGN PATENT DOCUMENTS

| KR | 100825789 | 4/2008 |
|---|---|---|
| KR | 1020100119625 | 11/2010 |

OTHER PUBLICATIONS

Office Action issued by the Korean Intellectual Property Office on Aug. 16, 2012.

* cited by examiner

*Primary Examiner* — Kyoung Lee
(74) *Attorney, Agent, or Firm* — IP & T Group LLP

(57) ABSTRACT

A non-volatile memory device includes a semiconductor substrate having a peripheral circuit region and a cell region, wherein the cell region of the semiconductor substrate is lower in height than the peripheral circuit region of the semiconductor substrate, a control gate structure disposed over the cell region of the semiconductor substrate and comprising a plurality of inter-layer dielectric layers that are alternately stacked with a plurality of control gate electrodes, a first insulation layer covering the cell region of the semiconductor substrate where the control gate structure is formed, a selection gate electrode disposed over the first insulation layer, and a peripheral circuit device disposed over the peripheral circuit region of the semiconductor substrate.

20 Claims, 7 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-0050032, filed on May 26, 2011, which is incorporated herein by reference in its entirety.

BACKGROUND

1. Field

Exemplary embodiments of the present invention relate to a non-volatile memory device and a method for fabricating the same, and more particularly, to a non-volatile memory device having a three-dimensional (3D) structure where a plurality of memory cells are stacked, and a method for fabricating the same.

2. Description of the Related Art

A non-volatile memory device retains data stored therein even when a power supply is cut off. Here, there are diverse types of non-volatile memory devices such as NAND-type flash memory devices.

In improving the integration degree of a non-volatile memory device, two-dimensional (2D) structures where memory cells are formed in a single layer over a semiconductor substrate have reached physical limits. Thus, a non-volatile memory device having a three-dimensional (3D) structure where a plurality of memory cells are formed along cylindrical channels that are formed vertically from a semiconductor substrate have been developed.

To further increase the integration degree of a non-volatile memory device having a three-dimensional structure, the number of gate electrode layers and inter-layer dielectric layers that are alternately stacked over cell regions of the semiconductor substrate is to increase. Such an increase may cause a step height difference between cell regions and peripheral circuit regions of the semiconductor substrate and lead to difficulties in performing a process for forming contacts in the peripheral circuit regions. For example, in the course of forming contact holes having a high aspect ratio, an occurrence of a not-open contact and attacks against structures underneath the contact holes may be caused.

SUMMARY

An exemplary embodiment of the present invention is directed to a non-volatile memory device that may protect an understructure from being attacked and/or prevent an occurrence of a not-open contact so as to improve process yield and reliability by removing a step height between cell regions and peripheral circuit regions of a semiconductor substrate to facilitate and simplify the process, and a method for fabricating the non-volatile memory device.

In accordance with an exemplary embodiment of the present invention, a non-volatile memory device includes: a semiconductor substrate having a peripheral circuit region and a cell region, wherein the cell region of the semiconductor substrate is lower in height than the peripheral circuit region of the semiconductor substrate; a control gate structure disposed over the cell region of the semiconductor substrate and comprising a plurality of inter-layer dielectric layers that are alternately stacked with a plurality of control gate electrodes; a first insulation layer covering the cell region of the semiconductor substrate where the control gate structure is formed; a selection gate electrode disposed over the first insulation layer; and a peripheral circuit device disposed over the peripheral circuit region of the semiconductor substrate.

In accordance with another exemplary embodiment of the present invention, a method for fabricating a non-volatile memory device includes: partially removing a cell region of a semiconductor substrate until the cell region of the semiconductor substrate is lower in height than a peripheral circuit region of the semiconductor substrate; forming a control gate structure comprising a plurality of inter-layer dielectric layers that are alternately stacked with a plurality of control gate electrodes over the cell region of the semiconductor substrate; forming a first insulation layer to cover the cell region of the semiconductor substrate with the control gate structure disposed thereon; and forming a selection gate electrode over the first insulation layer and forming a peripheral circuit device over the peripheral circuit region of the semiconductor substrate.

In accordance with yet another exemplary embodiment of the present invention, a non-volatile memory device includes: a semiconductor substrate having a peripheral circuit region and a cell region, wherein the semiconductor substrate is lower in height at the cell region than at the peripheral circuit region; a plurality of memory cells vertically stacked over the cell region of the semiconductor substrate, wherein each memory cell includes a control gate electrode layer formed over an inter-layer dielectric layer; an additional layer formed over the plurality of memory cells and the cell region; a selection gate electrode formed over the additional layer and the cell region; junction regions formed in the peripheral circuit region of the semiconductor substrate; a gate electrode formed over the peripheral circuit region and between the junction regions to operate as a control gate of a transistor, wherein an upper surface of the additional layer is even with an upper surface of the junction regions.

DETAILED DESCRIPTION

Figure 1A:
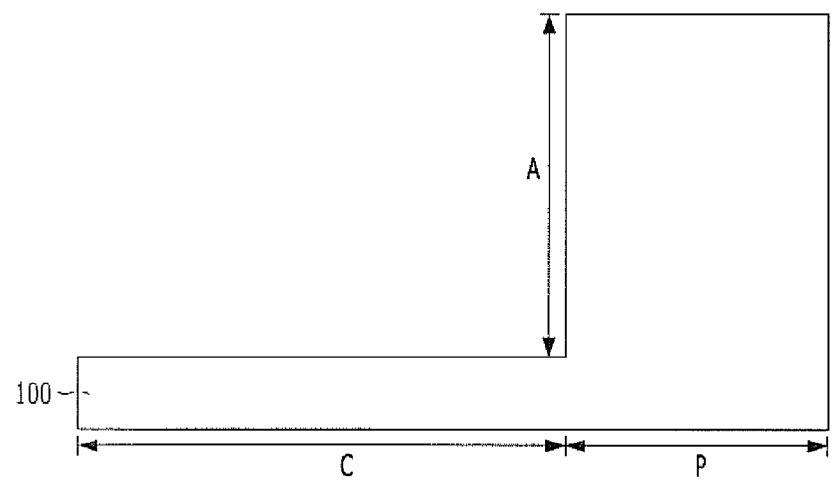
FIGS. 1A to 1G are cross-sectional views illustrating a method for fabricating a non-volatile memory device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
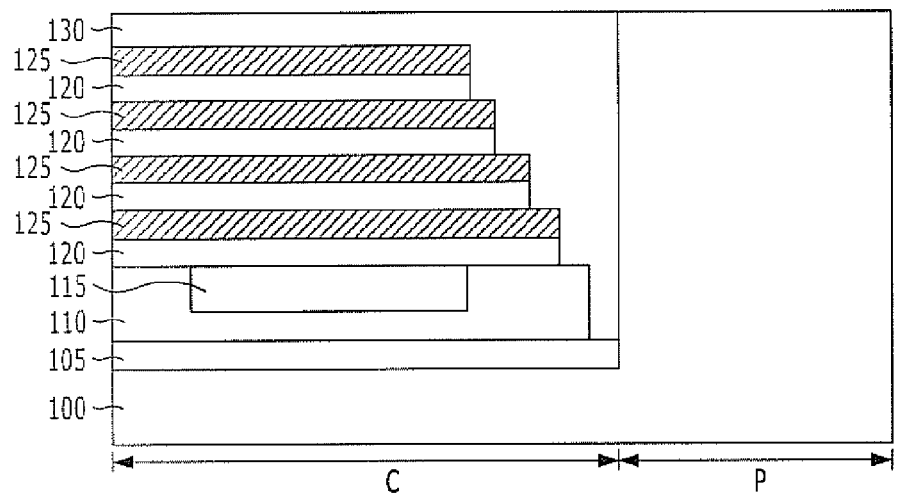
Figure 1C:
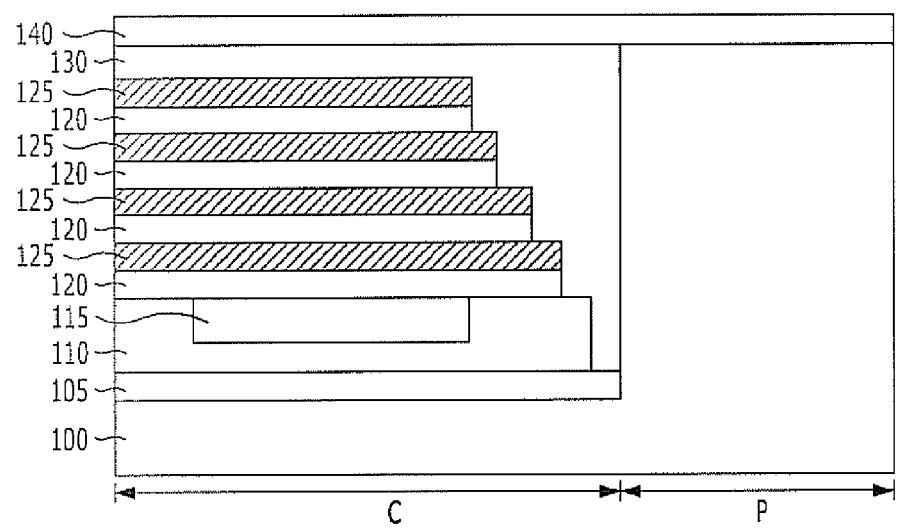
Figure 1D:
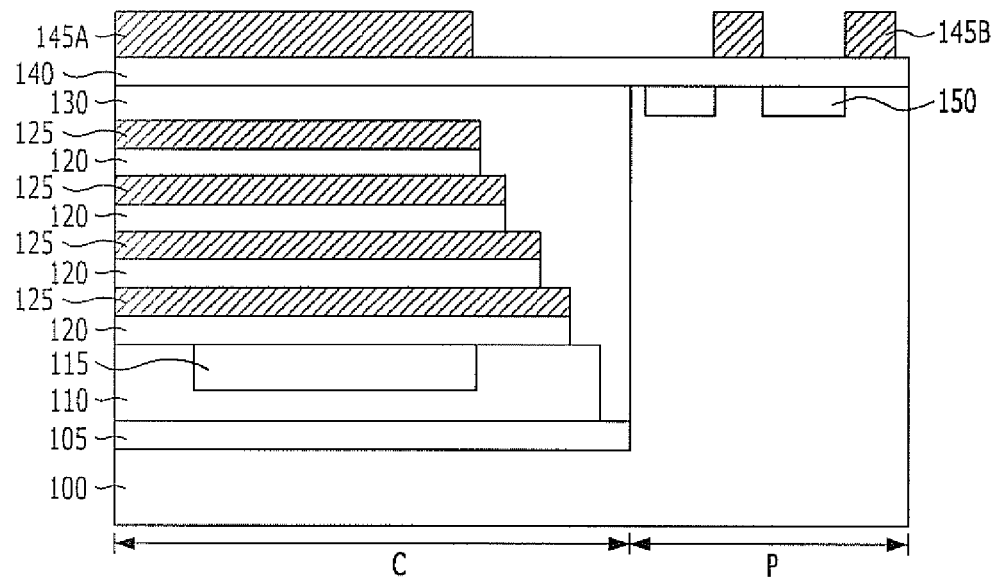
Figure 1E:
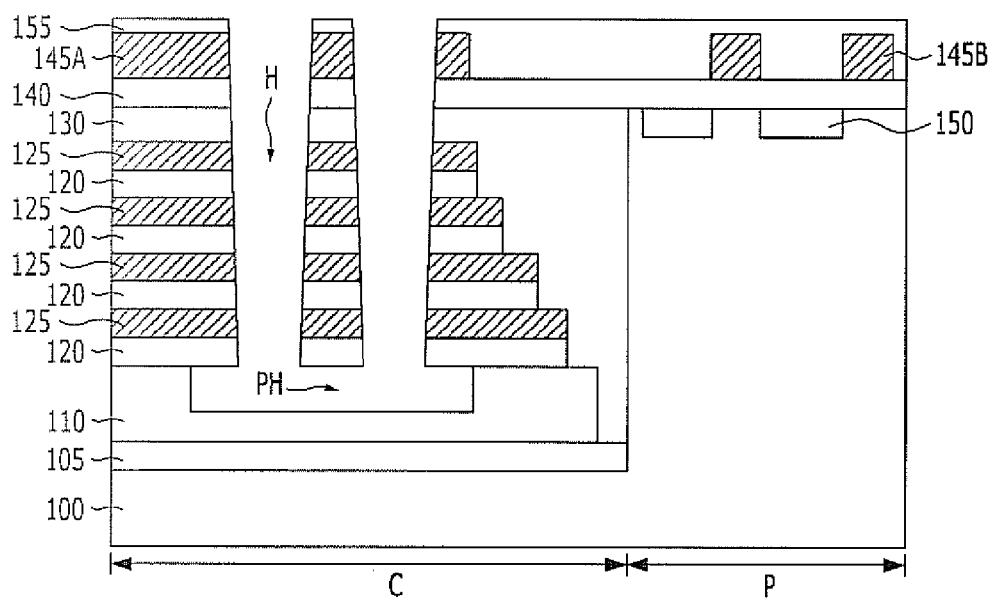
Figure 1F:
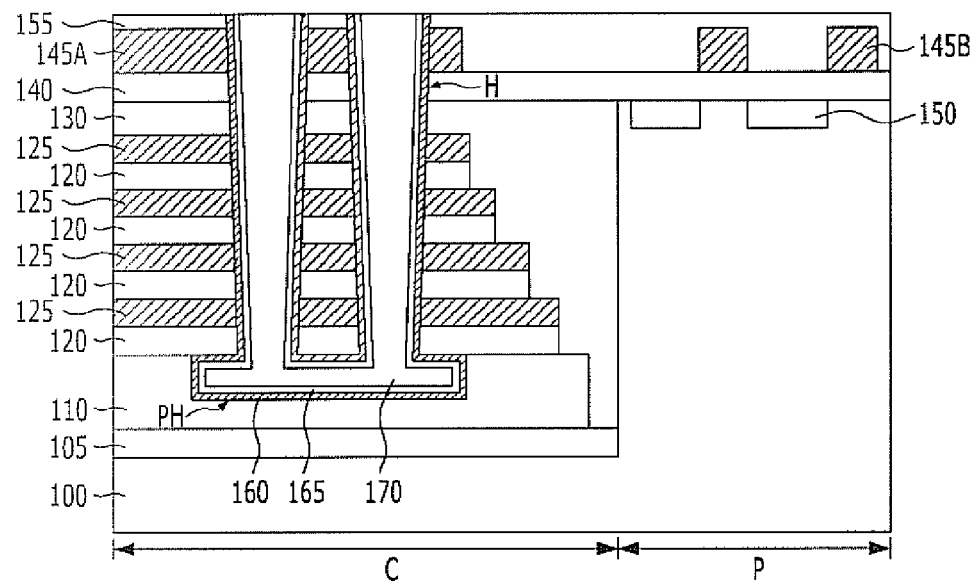
Figure 1G:
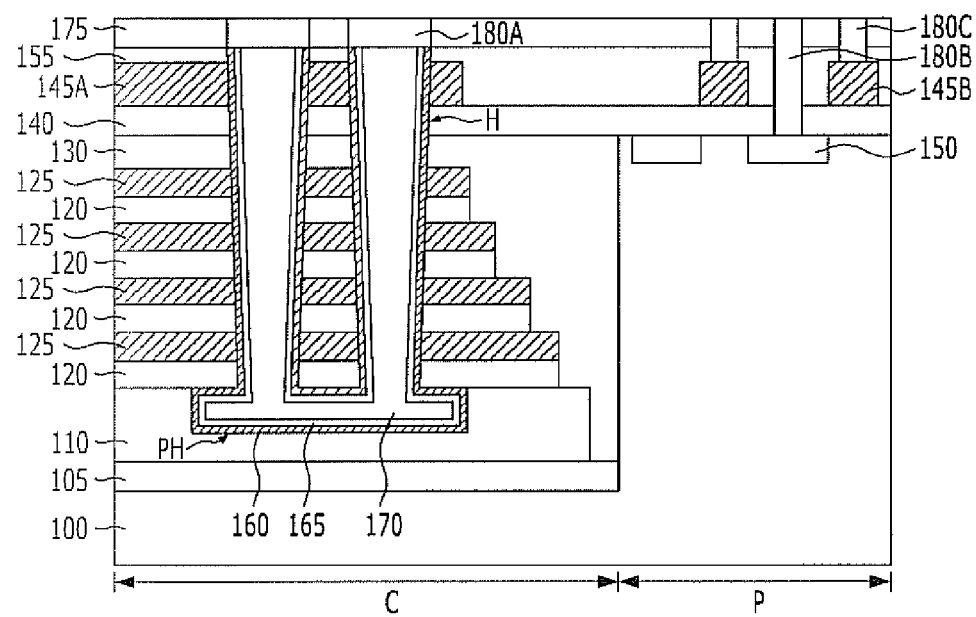

FIGS. 1A to 1G are cross-sectional views illustrating a method for fabricating a non-volatile memory device in accordance with a first exemplary embodiment of the present invention. In particular, FIG. 1G is a cross-sectional view showing a semiconductor device in accordance with the first exemplary embodiment of the present invention, and FIGS. 1A to 1F are cross-sectional views illustrating intermediate steps of a process for fabricating the semiconductor device shown in FIG. 1G.

Referring to FIG. 1A, a semiconductor substrate 100 including a cell region C and a peripheral circuit region P is provided. The semiconductor substrate 100 may be a silicon substrate.

Subsequently, the cell region C of the semiconductor substrate 100 is etched until the cell region C of the semiconductor substrate 100 becomes lower than the peripheral circuit region P by a desired height (refer to a reference symbol A in the drawing). Here, the step height A between the cell region C and the peripheral circuit region P of the semiconductor substrate 100 may be equal to the sum of the height of a subsequently formed control gate structure where a plurality of inter-layer dielectric layers and a plurality of control gate electrodes are alternately stacked, the height of a pipe connection gate electrode, and the height of an isolation insulation layer.

Subsequent to the etching of the cell region C, although not illustrated, an ion implantation process for forming a well or controlling a threshold voltage may be performed on the peripheral circuit region P of the semiconductor substrate 100.

Referring to FIG. 1B, an isolation insulation layer 105 is formed over the cell region C of the semiconductor substrate 100. Here, the isolation insulation layer 105 is a layer for isolating a pipe connection gate electrode 110 from the semiconductor substrate 100. The isolation insulation layer 105 may be a silicon oxide layer.

Subsequently, a pipe connection gate electrode 110 is formed over the isolation insulation layer 105. Here, the pipe connection gate electrode 110 may include a conductive material, e.g., polysilicon.

Subsequently, a groove is formed in the inside of the pipe connection gate electrode 110 by selectively etching the pipe connection gate electrode 110, and a sacrificial layer pattern 115 filling the groove is formed. Here, the sacrificial layer pattern 115 defines a space where a pipe channel hole, which will be described later, is to be formed, and the sacrificial layer pattern 115 may include a dielectric material, such as, a silicon nitride layer.

Subsequently, a plurality of inter-layer dielectric layers 120 and a plurality of control gate electrodes 125 are alternately disposed over the pipe connection gate electrode 110 where the sacrificial layer pattern 115 is formed. Throughout this disclosure, the structure where the inter-layer dielectric layers 120 are alternatively staked with the control gate electrodes 125 is referred to as a control gate structure.

Here, the inter-layer dielectric layers 120 may be silicon oxide layers, and the control gate electrodes 125 may include a conductive material such as polysilicon. Also, the control gate structure may be formed to have a shape of stairs to provide a space for forming contacts (not shown), which are to be electrically connected to the control gate electrodes 125. More specifically, an end portion of each control gate electrode 125 may have a shape protruded in a horizontal direction from other overlying control gate electrodes 125.

Subsequently, a first insulation layer 130 is formed to cover the cell region C of the semiconductor substrate 100 where the control gate structure is formed. The first insulation layer 130 may be formed by forming a silicon oxide layer over a substrate structure including the control gate structure and performing a planarization process until the upper surface of the peripheral circuit region P of the semiconductor substrate 100 is exposed so that the upper surface of the first insulation layer 130 over the cell region C is even with the upper surface of the peripheral circuit region P (that is, Here, the planarization process may be a Chemical Mechanical Polishing (CMP) process.

Referring to FIG. 1C, a gate insulation layer 140 is formed over the peripheral circuit region P of the semiconductor substrate 100 and the first insulation layer 130. The gate insulation layer 140 may be a silicon oxide layer. Although not illustrated, the gate insulation layer 140 disposed over the peripheral circuit region P of the semiconductor substrate 100 may be uneven in thickness. For example, a portion where a high-voltage transistor is positioned may be relatively thick, while a portion where a low-voltage transistor is positioned may be relatively thin.

Referring to FIG. 1D, a conductive layer (not shown) such as a polysilicon layer is formed over the gate insulation layer 140, and then patterned to form a selection gate electrode 145A in the cell region C and a peripheral circuit gate electrode 145B in the peripheral circuit region P.

Subsequently, a junction region 150 is formed by implanting impurity ions into the peripheral circuit region P of the semiconductor substrate 100 on both sides of the peripheral circuit gate electrode 145B. The junction region 150 may include a source region and a drain region.

Referring to FIG. 1E, a second insulation layer 155 is formed to cover the gate insulation layer 140 where the selection gate electrode 145A and the peripheral circuit gate electrode 145B are disposed, and then a pair of channel holes H that exposes the sacrificial layer pattern 115 is formed by selectively etching the second insulation layer 155, the selection gate electrode 145A, the gate insulation layer 140, the first insulation layer 130, and the control gate structure of the cell region C.

Subsequently, the sacrificial layer pattern 115 exposed by the channel holes H is removed. The sacrificial layer pattern 115 may be removed through a wet etch process. As a result, a pipe channel hole PH is formed in the space from which the sacrificial layer pattern 115 is removed.

Referring to FIG. 1F, a memory layer 160 is formed along the internal walls of the channel holes H and the pipe channel hole PH. The memory layer 160 may include an oxide layer used as a charge blocking layer, a nitride layer used as a charge trapping layer, and an oxide layer used as a tunnel insulation layer. In other words, the memory layer 160 may have a triple-layer structure of oxide layer-nitride layer-oxide layer (ONO).

Subsequently, a channel layer 165 is formed over the memory layer 160, and then a third insulation layer 170 is formed to fill the channel holes H and the pipe channel hole PH where the channel layer 165 is formed. The channel layer 165 may include polysilicon, and the third insulation layer 170 may be a silicon oxide layer.

Referring to FIG. 1G, a fourth insulation layer 175 is formed over a substrate structure where the channel layer 165 is formed, and then contact holes that expose the channel layer 165, the junction region 150, and the peripheral circuit gate electrode 145B are formed by selectively etching the fourth insulation layer 175, the second insulation layer 155, and the gate insulation layer 140. The fourth insulation layer 175 may be a silicon oxide layer.

Subsequently, a conductive layer (not shown) including tungsten is formed at a thickness to fill the contact holes, and then a planarization process such as a CMP process is performed until the upper surface of the fourth insulation layer 175.

As a result of the process, a first contact 180A that is electrically connected to the channel layer 165 through the fourth insulation layer 175, a second contact 180B that is electrically connected to the junction region 150 through the fourth insulation layer 175, the second insulation layer 155 and the gate insulation layer 140, and a third contact 180C that is electrically connected to the peripheral circuit gate electrode 145B through the fourth insulation layer 175 and the second insulation layer 155 are formed. The first contact 180A, the second contact 180B, and the third contact 180C may each include a conductive material, e.g., tungsten.

Subsequently, although not illustrated, metal lines may be formed over the fourth insulation layer 175, and the metal lines may be coupled with the first contact 180A, the second contact 180B, and the third contact 180C, respectively.

According to the non-volatile memory device and a fabrication method thereof in accordance with the first exemplary embodiment of the present invention, which is described above, a fabrication process may be simplified as a step height between the cell region C and the peripheral circuit region P of the semiconductor substrate 100 is avoided. Particularly, adequate process yield and reliability may be obtained by reducing the aspect ratios of the second contact 180B coupled with the junction region 150 and the third contact 180C coupled with the peripheral circuit gate electrode 145B and thereby preventing an occurrence of a not-open contact and attacks against structures underneath the contacts.

The process may be further simplified by patterning a conductive layer to simultaneously form the selection gate electrode 145A of the cell region C and the peripheral circuit gate electrode 145B of the peripheral circuit region P.

Meanwhile, a non-volatile memory device where the peripheral circuit gate electrode 145B and the junction region 150 are formed in the peripheral circuit region P is described in this exemplary embodiment of the present invention, but the present invention is not limited thereto. According to another embodiment of the present invention, other peripheral circuit devices such as a resistor body may be included.

FIGS. 2A to 2F are cross-sectional views illustrating a method for fabricating a non-volatile memory device in accordance with a second exemplary embodiment of the present invention. In the description of this exemplary embodiment, the description of elements that are the same or substantially the same as that of the first exemplary embodiment is omitted as being redundant. The etching process of FIG. 1A is performed to form the etched cell region C of FIG. 2A.

Figure 2A:
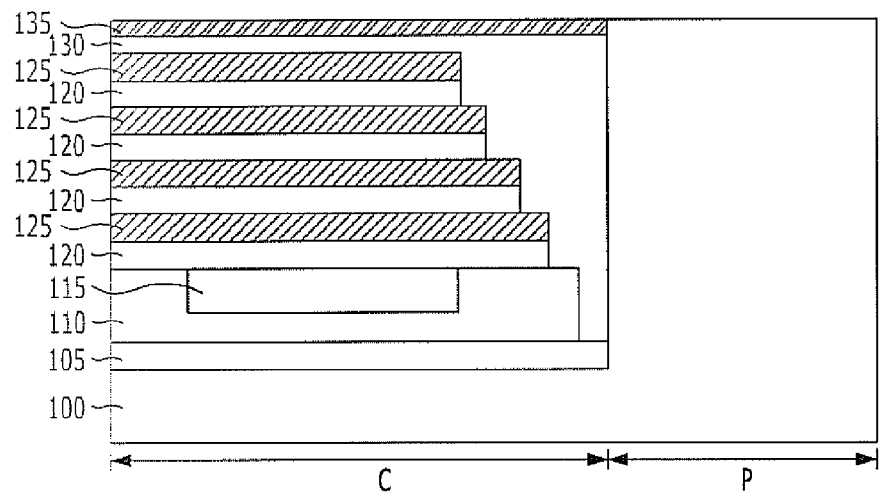
FIGS. 2A to 2F are cross-sectional views illustrating a method for fabricating a non-volatile memory device in accordance with a second exemplary embodiment of the present invention.

Referring to FIG. 2A, an isolation insulation layer 105 is formed over the cell region C of the semiconductor substrate 100, and then a pipe connection gate electrode 110 is formed over the isolation insulation layer 105.

Subsequently, a groove is formed within the pipe connection gate electrode 110 by selectively etching the pipe connection gate electrode 110, and then a sacrificial layer pattern 115 is formed to fill the groove. Subsequently, a control gate structure where a plurality of inter-layer dielectric layers 120 are alternatively stacked with a plurality of the control gate electrodes 125 is formed over the pipe connection gate electrode 110 where the sacrificial layer pattern 115 is formed.

Subsequently, a first insulation layer 130 is formed to cover the cell region C of the semiconductor substrate 100 where the control gate structure is formed, and a protective layer 135 is formed to cover the cell region C of the semiconductor substrate 100 where the first insulation layer 130 is formed.

Here, the protective layer 135 protects the uppermost layer forming the control gate electrodes 125 from being damaged. The protective layer 135 may be a nitride layer and it may be formed to have an upper surface that is even with the upper surface of the peripheral circuit region P of the semiconductor substrate 100.

Figure 2B:
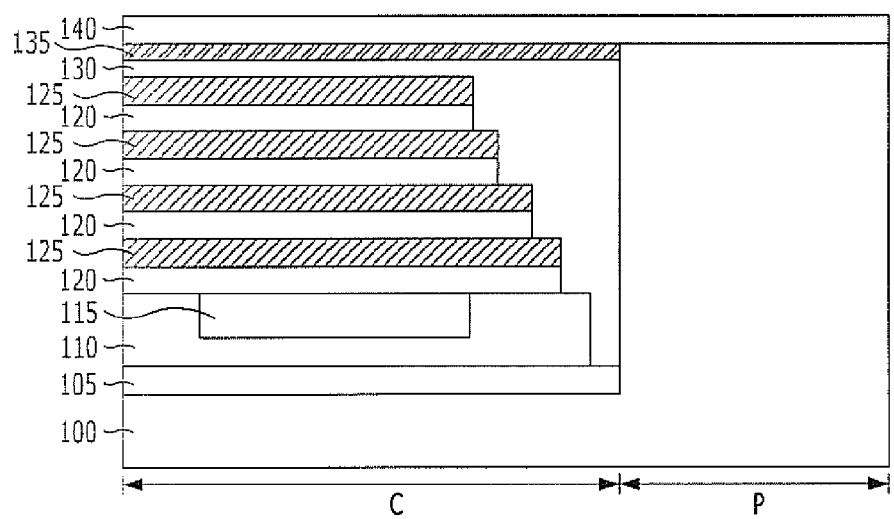

Referring to FIG. 2B, a gate insulation layer 140 is formed over the protective layer 135 and the peripheral circuit region P of the semiconductor substrate 100.

Figure 2C:
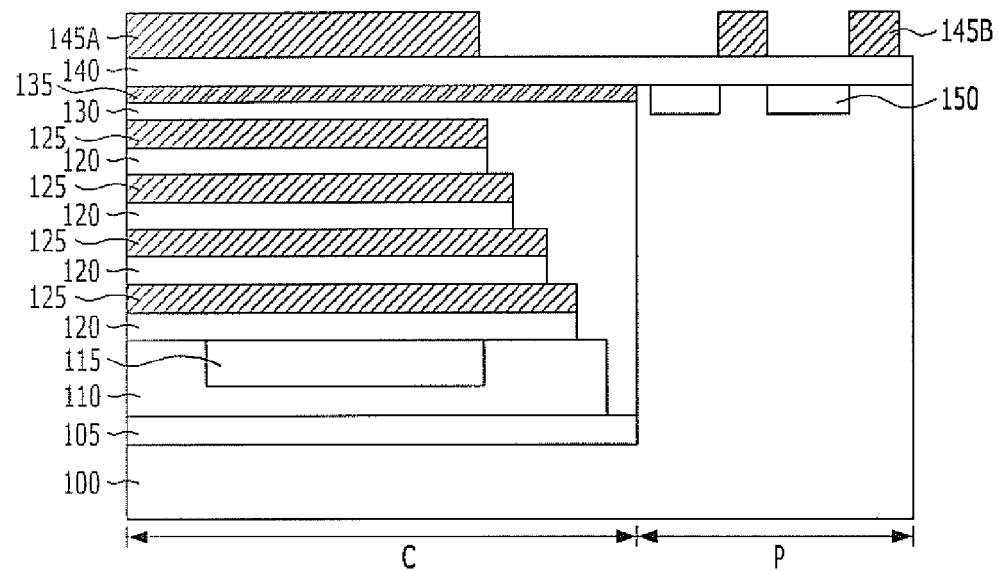

Referring to FIG. 2C, a selection gate electrode 145A of the cell region C and a peripheral circuit gate electrode 145B of the peripheral circuit region P are formed by forming a conductive layer (not shown) over the gate insulation layer 140 and then patterning the conductive layer.

Subsequently, a junction region 150 is formed by implanting impurity ions into the peripheral circuit region P of the semiconductor substrate 100 on both sides of the peripheral circuit gate electrode 145B.

Figure 2D:
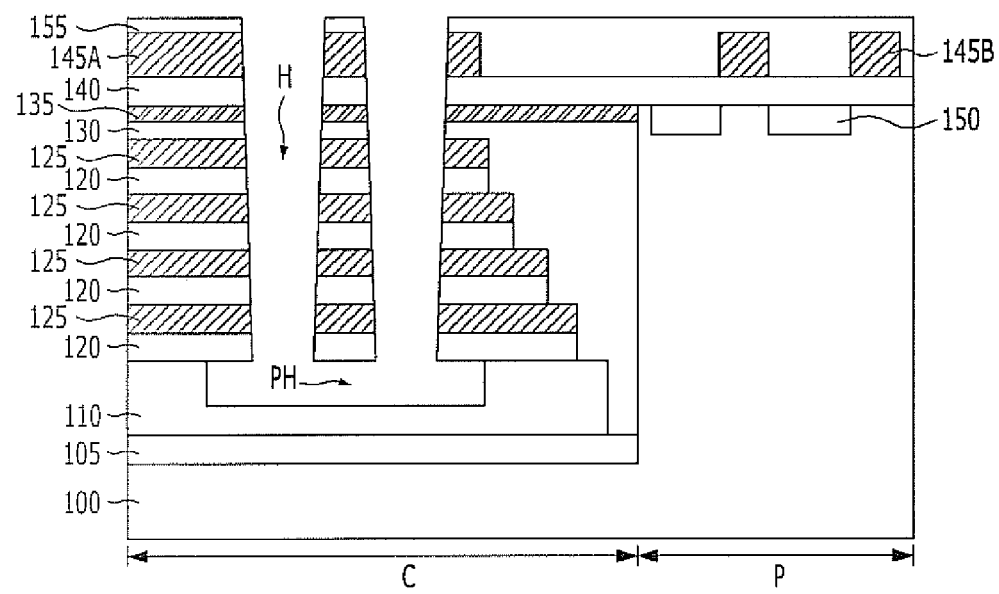

Referring to FIG. 2D, a pair of channel holes H that expose the sacrificial layer pattern 115 are formed by forming a second insulation layer 155 covering the gate insulation layer 140 where the selection gate electrode 145A and the peripheral circuit gate electrode 145B are formed and then selectively etching the second insulation layer 155, the selection gate electrode 145A, the gate insulation layer 140, the protective layer 135, the first insulation layer 130, and the control gate structure of the cell region C.

Subsequently, a pipe channel hole PH is formed by removing the sacrificial layer pattern 115 that is exposed by the channel holes H.

Figure 2E:
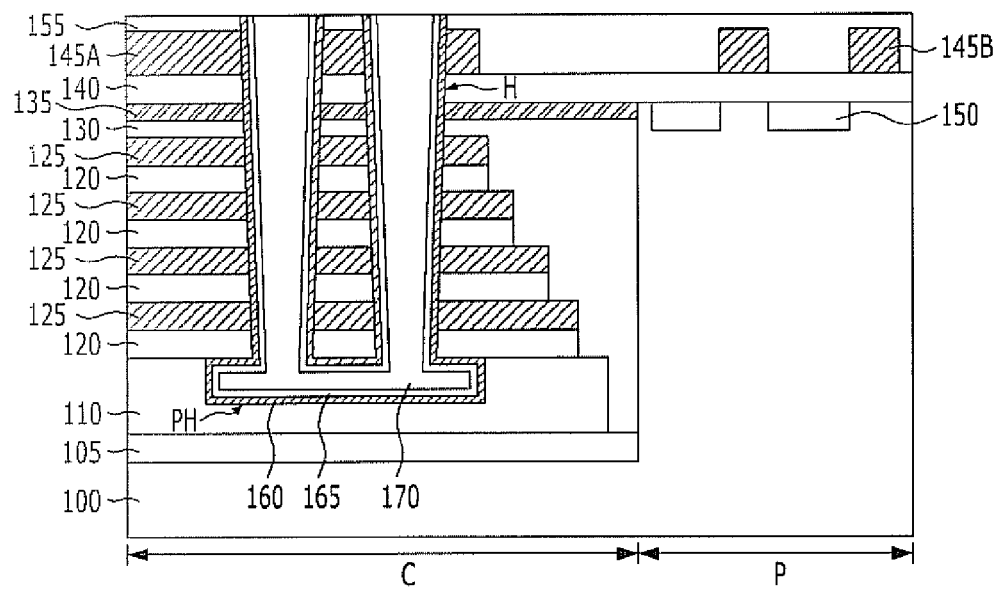

Referring to FIG. 2E, a memory layer 160 is formed on the internal walls of the channel holes H and the pipe channel hole PH, and a channel layer 165 is formed over the memory layer 160.

Subsequently, a third insulation layer 170 is formed to fill the channel holes H and the pipe channel hole PH where the channel layer 165 is formed.

Figure 2F:
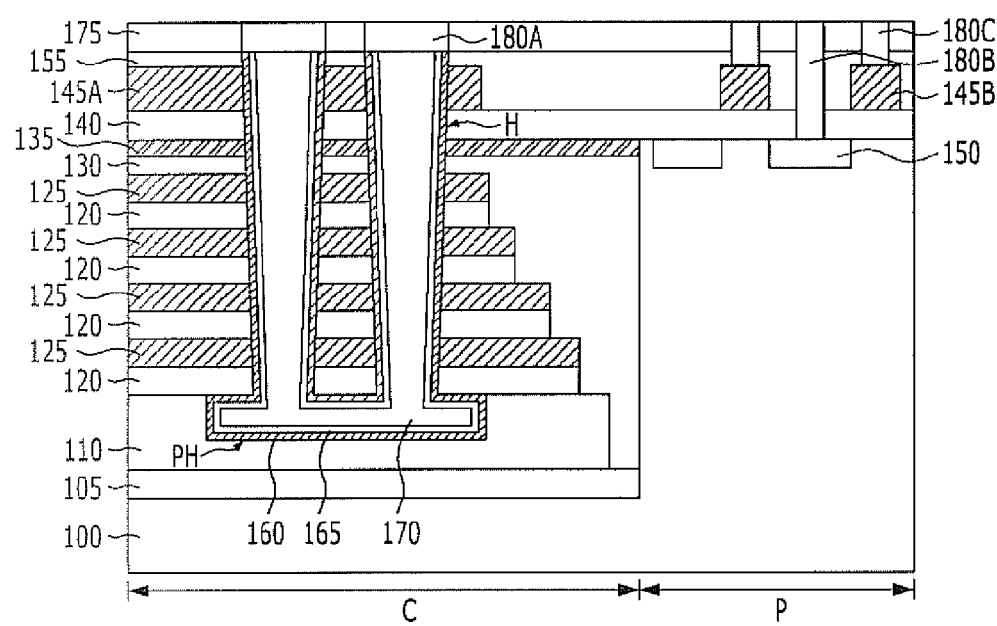

Referring to FIG. 2F, after a fourth insulation layer 175 over the substrate structure including the channel layer 165, a first contact 180A that is electrically connected to the channel layer 165 through the fourth insulation layer 175, a second contact 180B that is electrically connected to the junction region 150 through the fourth insulation layer 175, the second insulation layer 155 and the gate insulation layer 140, and a third contact 180C that is electrically connected to the peripheral circuit gate electrode 145B through the fourth insulation layer 175 and the second insulation layer 155 are formed.

The second exemplary embodiment of the present invention described above is different from the first exemplary embodiment in that the protective layer 135 covering the cell region C of the semiconductor substrate 100 over the first insulation layer 130 is additionally formed. Accordingly, the control gate electrodes 125 disposed in the uppermost portion may be protected from being attacked and thus adequate process yield and reliability of a non-volatile memory device may be obtained.

Although a non-volatile memory device having a three-dimensional structure including a pipe connection gate electrode is described in the first and second exemplary embodiments of the present invention, the scope and spirit of the present invention is not limited thereto. The above-described embodiments are exemplary, and the present invention may be applied to any reasonably suitable structure such as non-volatile memory devices having a three-dimensional structure where a plurality of memory cells are stacked along the channels protruded perpendicularly to a semiconductor substrate.

According to exemplary embodiments of the non-volatile memory device and the fabrication method thereof, a process may be simplified as a step height between a cell region and a peripheral circuit region of a semiconductor substrate is avoided, and adequate process yield and reliability may be obtained by preventing an occurrence of a not-open contact and protecting structures underneath contacts from being attacked.

While the present invention has been described with respect to the specific exemplary embodiments, it will be apparent to those skilled in the art that various changes and modifications may be made without departing from the spirit and scope of the invention as defined in the following claims.

What is claimed is:

1. A non-volatile memory device, comprising:
a semiconductor substrate having a peripheral circuit region and a cell region, wherein the cell region of the semiconductor substrate is lower in height than the peripheral circuit region of the semiconductor substrate;
a control gate structure disposed over the cell region of the semiconductor substrate and comprising a plurality of inter-layer dielectric layers that are alternately stacked with a plurality of control gate electrodes;
a first insulation layer covering the cell region of the semiconductor substrate where the control gate structure is formed;
a selection gate electrode disposed over the first insulation layer; and
a peripheral circuit device disposed over the peripheral circuit region of the semiconductor substrate.

2. The non-volatile memory device of claim 1, further comprising:
a protective layer disposed over the first insulation layer and protecting the control gate structure.

3. The non-volatile memory device of claim 1, further comprising:
a gate insulation layer disposed over the first insulation layer and the peripheral circuit region of the semiconductor substrate.

4. The non-volatile memory device of claim 1, wherein an upper surface of the first insulation layer is even with an upper surface of the peripheral circuit region of the semiconductor substrate.

5. The non-volatile memory device of claim 1, wherein the peripheral circuit device is formed of the same material as a conductive material for the selection gate electrode.

6. The non-volatile memory device of claim 1, further comprising:
a channel penetrating through the selection gate electrode and the control gate structure; and
a memory layer interposed between the channel and the control gate structure.

7. The non-volatile memory device of claim 1, further comprising:
a pipe connection gate electrode disposed under the control gate structure;
a pair of channels penetrating through the selection gate electrode and the control gate structure;
a pipe channel arranged to fill the pipe connection gate electrode and coupling lower ends of the channels with each other; and
a memory layer interposed between the channels and the control gate structure and between the pipe channel and the pipe connection gate electrode.

8. The non-volatile memory device of claim 1, further comprising:
an insulation layer disposed over the selection gate electrode and the peripheral circuit device; and
a contact coupled with the peripheral circuit device through the insulation layer.

9. A method for fabricating a non-volatile memory device, comprising:
partially removing a cell region of a semiconductor substrate until the cell region of the semiconductor substrate is lower in height than a peripheral circuit region of the semiconductor substrate;
forming a control gate structure comprising a plurality of inter-layer dielectric layers that are alternately stacked with a plurality of control gate electrodes over the cell region of the semiconductor substrate;
forming a first insulation layer to cover the cell region of the semiconductor substrate with the control gate structure disposed thereon; and
forming a selection gate electrode over the first insulation layer and forming a peripheral circuit device over the peripheral circuit region of the semiconductor substrate.

10. The method of claim 9, further comprising:
forming a protective layer for protecting the control gate structure over the first insulation layer after the forming of the first insulation layer.

11. The method of claim 9, further comprising:
forming a gate insulation layer over the first insulation layer and the peripheral circuit region of the semiconductor substrate after the forming of the first insulation layer.

12. The method of claim 9, wherein an upper surface of the first insulation layer is even with an upper surface of the peripheral circuit region of the semiconductor substrate.

13. The method of claim 9, wherein the peripheral circuit device is a peripheral circuit gate electrode and the forming of the selection gate electrode and the peripheral circuit gate electrode comprises:
forming a conductive layer over the first insulation layer and the peripheral circuit region of the semiconductor substrate; and
forming the selection gate electrode and the peripheral circuit gate electrode by patterning the conductive layer.

14. The method of claim 9, further comprising:
forming a channel hole penetrating through the selection gate electrode and the control gate structure; and
sequentially forming a memory layer and a channel layer on internal walls of the channel hole.

15. The method of claim 9, further comprising:
forming a pipe connection gate electrode having a sacrificial layer pattern over the cell region of the semiconductor substrate before the forming of the control gate structure;
forming a pair of channel holes that expose the sacrificial layer pattern by selectively etching the selection gate electrode and the control gate structure after the forming of the selection gate electrode and the peripheral circuit device;
forming a pipe channel hole coupling the channel holes with each other by removing the sacrificial layer pattern; and
sequentially forming a memory layer and a channel layer on internal walls of the channel holes and the pipe channel hole.

16. The method of claim 9, further comprising:
forming an insulation layer over the selection gate electrode and the peripheral circuit device; and
forming a contact coupled with the peripheral circuit device through the first insulation layer.

17. A non-volatile memory device, comprising:
- a semiconductor substrate having a peripheral circuit region and a cell region, wherein the semiconductor substrate is lower in height at the cell region than at the peripheral circuit region;
- a plurality of memory cells vertically stacked over the cell region of the semiconductor substrate, wherein each memory cell includes a control gate electrode layer formed over an inter-layer dielectric layer;
- an additional layer formed over the plurality of memory cells and the cell region;
- a selection gate electrode formed over the additional layer and the cell region;
- junction regions formed in the peripheral circuit region of the semiconductor substrate; and
- a gate electrode formed over the peripheral circuit region and between the junction regions to operate as a control gate of a transistor, wherein an upper surface of the additional layer is even with an upper surface of the junction regions.

18. The non-volatile memory device of claim 17, wherein the plurality of memory cells are formed in a control gate structure disposed over the cell region and the control gate structure includes a pair of channel holes penetrating through the control gate electrode layers and the inter-layer dielectric layers of the memory cells and further includes a pipe channel coupling lower ends of the channel holes with each other.

19. The non-volatile memory device of claim 18, wherein the control gate structure has a memory layer interposed between the channels and the control gate structure and the memory layer includes an oxide layer, a nitride layer and another oxide layer that are sequentially overlaid.

20. The non-volatile memory device of claim 17, wherein the additional layer is formed of a nitride layer.

* * * * *